United States Patent [19]

Tannhäuser et al.

[11] Patent Number: 4,580,264
[45] Date of Patent: Apr. 1, 1986

[54] ARRANGEMENT FOR TRANSMITTING CHECK CHARACTERS TO CONNECTOR ELEMENTS OF A TESTER

[75] Inventors: Rolf Tannhäuser, Krailling; Franz Herrmann, Schemmerhofen; Antun Vucsic, Munich, all of Fed. Rep. of Germany

[73] Assignee: Siemens Aktiengesellschaft, Berlin & Munich, Fed. Rep. of Germany

[21] Appl. No.: 534,252

[22] Filed: Sep. 21, 1983

[30] Foreign Application Priority Data

Oct. 7, 1982 [DE] Fed. Rep. of Germany ....... 3237208

[51] Int. Cl.$^4$ ............................................ G01R 31/28
[52] U.S. Cl. ........................................ 371/27; 371/20
[58] Field of Search ............................ 371/27, 20, 25; 324/73 R, 73 AT

[56] References Cited

U.S. PATENT DOCUMENTS

| | | | |
|---|---|---|---|
| 3,737,637 | 6/1973 | Frankeny et al. | 371/27 |
| 4,066,882 | 1/1978 | Esposito | 371/27 |
| 4,287,594 | 9/1981 | Shirasaka | 371/25 |
| 4,293,950 | 10/1981 | Shimizu et al. | 371/27 |
| 4,439,858 | 3/1984 | Petersen | 371/20 |
| 4,493,079 | 1/1985 | Hughes, Jr. | 371/27 |

Primary Examiner—Charles E. Atkinson
Attorney, Agent, or Firm—Hill, Van Santen, Steadman & Simpson

[57] ABSTRACT

When testing a unit under test, for example, a card module, check characters must be transmitted to the unit under test from the tester via connector elements. One selection device per connector element is provided in order to be able to transmit the correct check character over the correct connector element. Each selection device contains addresses of the check characters which are to be transmitted over the allocated connector element in an address register. During the test event, the assistance of a comparison device is employed in order to determine whether the addresses contained in the address register coincide with the addresses of check characters which are supplied by an input bus. Given equality, the allocated test signal is transmitted to the connector element. When a plurlity of check characters are allocated to one address, one of the check characters can be selected and transmitted to the connector element with the assistance of a multiplexer given equality of the addresses. Since respectively those check characters which are to be transmitted over the connector element are selected by a changeable address stored by the associated selection device, the check characters allocated to one address can be selected by a plurality of selection devices. The number of machine words comprised of address and allocated check character required per test operation is therefore considerably reduced.

9 Claims, 1 Drawing Figure

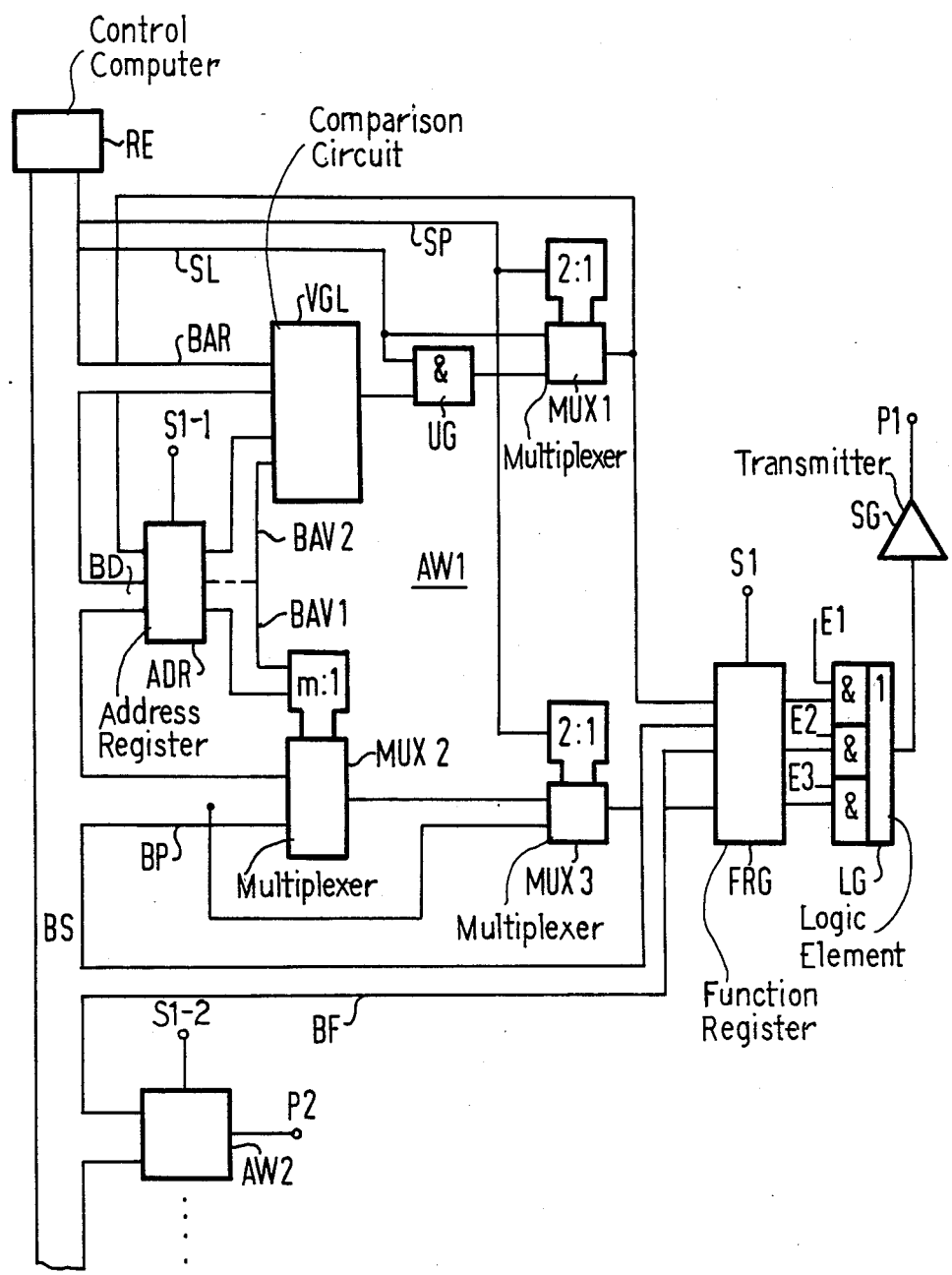

ARRANGEMENT FOR TRANSMITTING CHECK CHARACTERS TO CONNECTOR ELEMENTS OF A TESTER

BACKGROUND OF THE INVENTION

The invention relates to an arrangement for transmitting check characters to selectable connector elements of a tester to which a unit under test can be connected, wherein the individual connector element is selected with the assistance of an address.

Units under test having a multitude of electronic components, for example, card modules, must be tested for freedom from error before being built into, for example, a data processing system. To that end, they are tested with the assistance of a tester which generates the test signals required for testing the card module and which checks the output signals emitted by the card module. It must thereby be guaranteed that the proper test signals are supplied to the unit under test at its connector elements. Since the unit under test is connected to the tester via plug-type connections, the tester must be constructed such that the proper test signals are transmitted via the contact elements of the tester allocated to the contact elements of the unit under test.

A respective address is permanently allocated to the connector elements, for example, terminal pins, in order to be able to supply the desired test signals to the individual contact elements or connector elements of the tester. When a test signal is to be transmitted over a specific connector element of the tester, then this connector element is addressed by the tester and the check character is then supplied to the addressed connector element. A check character can be evaluated with the assistance of a function code in order to produce the desired test signal. For example, whether the test signal which is developed from the check character is to have TTL level or ECL level, etc., can be determined with the assistance of the function code.

In order to transmit a specific test signal over a connector element of the tester, a word referred to below as the machine word must be evaluated in the tester, said machine word consisting of an address and a check character. Such a machine word was respectively necessary, thus, for each test signal to be transmitted over a connector element. Even when, for example, the same test signal is to be transmitted over a plurality of connector elements, a separate machine word had to be evaluated for each connector element because of the different addresses of the connector elements in the tester. The consequence was that a great number of machine words was necessary for testing a unit under test.

SUMMARY OF THE INVENTION

The object underlying the invention resides in specifying an arrangement for transmitting check characters to connector elements of a tester wherein fewer machine words are required when testing a unit under test and, as a result thereof, the test speed can be considerably increased. This object is achieved given an arrangement of the type initially specified in that a selection means is provided for each connector element, the addresses allocated to the check character to be transmitted over the connector element being changeably stored therein, and said selection means comparing these addresses during the test event to addresses of the check characters required for the test which are offered to the selection means on an input bus and transmitting the allocated check character to the connector element given equality.

In the inventive arrangement, thus, the address is not permanently allocated to the connector element; on the contrary, the addresses of the check characters which are to be supplied to the connector element can be rolled into the allocated selection means before the test event. During the actual test event, each selection means then selects the check characters which are to be transmitted over the connector element, selecting them with the assistance of the stored addresses. It is thereby also possible that the same address is stored in a plurality of selection means so that a check character is simultaneously supplied to a plurality of connector elements with one machine word.

It is advantageous when a plurality of check characters are allocated to a single address. The machine word is then formed from an address and a plurality of check characters allocated to said address.

It is thus possible that a plurality of selection means select the same machine word but then derive different check characters from the machine word and transmit them to the allocated connector elements. Of course, however, it is also possible that a plurality of selection means derive the same check character from the machine word. The selection of the check character from a machine word can ensue with the assistance of an auxiliary address which is likewise stored in the selection means.

A simply constructed selection means can consist of an address register in which the address and the auxiliary address are stored, of a comparison circuit which compares the address stored in the address register to the address pending at the input bus, of a multiplexer adjustable by the auxiliary address, its inputs being connected to the input bus for the supply of the check characters and said multiplexer through-connecting the check character allocated to the auxiliary address to the output.

For the purpose of evaluating the selected check character in accord with the function code, a function register can be provided in each selection means, said function register being connected, on the one hand, to the input bus for the acceptance of the function code and being connected, on the other hand, to the first multiplexer for the acceptance of the check character. A fixed allocation of a specific input line to the first multiplexer to the function register can be achieved with the assistance of a second multiplexer whose one input is connected to the output of the first multiplexer and whose second input is connected to one of the input lines of said first multiplexer and which through-connects one of the two inputs to the output as a function of a control signal.

A fixed address can also be allocated to the connector elements in a simple manner. To that end, a selection signal need merely be supplied to the function register and a second multiplexer need merely be switched over to a given input line of the first multiplexer. Since the selection of the function register ensues either via a selection signal or via the output signal of the comparison circuit, the proper selection signal can be selected as a function of a control signal with the assistance of a third multiplexer.

The invention is explained in further detail with reference to an exemplary embodiment illustrated in the FIGURE on the accompanying drawing sheet; and other objects, features and advantages will be apparent from this detailed disclosure and from the appended claims.

BRIEF DESCRIPTION OF THE DRAWING

The single FIGURE is an electric circuit diagram for illustrating an exemplary embodiment of the present invention.

DETAILED DESCRIPTION

Selection devices AW1, AW2, etc., are connected to an input bus BS which is connected to a control computer RE. Each selection device AW is connected to a connector element P, for example, a terminal pin. Thus, the selection device AW1 is connected to the connector element P1, and the selection device AW2 is connected to the connector element P2. The machine words which contain the function code, the address and the check character are offered to the selection devices AW over the input bus BS. Each selection device AW selects machine words and, thus, check characters which are to be transmitted over the associated one of the connector elements P, selecting them from the machine words offered over the input bus BS with the assistance of the address.

Each selection device AW contains an address register ADR which is connected to the input bus BS. The addresses of the machine words which are to be selected by the selection device AW are stored in the address register ADR. When a plurality of check characters are contained in one machine word, the auxiliary address with which a specific check character is selected from the plurality of check characters in the machine word can also be stored in the address register ADR.

A comparison circuit VGL serves for the selection of the machine words with the assistance of the address in the address register ADR, said comparison circuit VGL being connected, on the one hand, to the address register ADR over an internal bus BAV2 and being connected, on the other hand, to the input bus over the internal bus BAR. The comparison circuit VGL compares the addresses of the machine words offered the input bus BS to the addresses contained in the address register ADR. When equality derives, the comparison circuit VGL then emits a selection signal.

A first multiplexer MUX2 is connected to the address register ADR via an internal bus BAV1, said first multiplexer MUX2 being required when a plurality of check characters are contained in a machine word. One of the check characters can then be selected from the machine word with the first multiplexer MUX2 with the assistance of an auxiliary address which is likewise contained in the address register ADR and which is transmitted to the multiplexer over the internal bus BAV1. To that end, the first multiplexer MUX2 is connected to the input bus BS via an internal bus BP. As a function of the auxiliary address, the first multiplexer MUX2 through-connects one of the input lines of the multiplexer to the output. One of the check characters is thus selected.

The check characters which have been selected with the assistance of the comparison circuit VGL and the first multiplexer MUX2 are supplied to a function register FRG. The function register FRG, further, is connected to the input bus BS over an internal bus BF. The function code contained in the machine word is transmitted into the function register FRG over said internal bus BF. In accord with the function code, one of the register cells of the function register FRG is selected, and the check character is transferred into it. The acceptance of the check character, however, only ensues when a selection signal is supplied to the selection input of the function register FRG. This selection signal is, for example, the selection signal appearing at the output of the comparison circuit VGL when said comparison circuit has identified equality between the address of the pending machine word and the stored address. In this case, the check character selected over the first multiplexer MUX2 is a check character which is to be transmitted over the connector element P1.

A logic element LG with which the outputs of the function register FRG are combined into one line is connected to the output of the function register FRG. This line leads to a transmitter SG which generates the test signal which is to be supplied to the unit under test over the connector element P1, generating said test signal from the check character.

The selection device AW described up to now functions in the following manner: before the test event for a specific unit under test begins, the addresses of the machine words which are to be selected by the selection devices are rolled into the address registers ADR of the respective selection devices AW. At the same time, the auxiliary addresses are also rolled into the address register ADR, these declaring which of the input lines the first multiplexer MUX2 should through-connect to the output. During the actual test event, the machine words required for the test are offered to the selection devices AW over the input bus BS. With the assistance of the address stored in the address register ADR, each selection device AW seeks out the machine words by which the associated function register FRG is to be driven. The allocated check character is selected from the machine word with the assistance of the first multiplexer MUX2 as a function of the auxiliary address from the address register ADR and is likewise supplied to the function register FRG. On the basis of the function code, the function register FRG decides into which register cell the check character is to be transferred upon appearance of the selection signal from the comparison circuit VGL. How the check character is to be further treated is thus also determined. A test signal corresponding to the function code and the check character is then supplied by the transmitter SG to the connector element P1. The selection signal of the comparision circuit VGL is also supplied to the address register ADR to activate the address register to output the next address to the internal bus BAV2 (if S1 is active).

When the selection of the machine words is not to ensue on the basis of a stored address supplied in advance to the selection devices AW, but when, on the contrary, a fixed allocation of the machine words to the connector elements P is to ensue, this can occur by means of a simple change of the selection devices AW. To that end, a second multiplexer MUX3 is inserted between the first multiplexer MUX2 and the function register FRG, a second input of said second multiplexer MUX3 being permanently connected with a dedicated input line leading to the first multiplexer MUX2. Further, a third multiplexer MUX1 is inserted between the comparison circuit VGL and the selection input of the function register FRG. A selection signal SL emitted by the control computer RE is supplied to a second input of the third multiplexer MUX1. With the assistance of a control signal SP, the multiplexers MUX1 and MUX3 can now be switched from the operating mode in which the selection device AW selects the machine words into the operating mode in which the computer RE centrally allocates the check characters to be transmitted over the connector elements P. The selection signal SL can be combined with the selection signal from the comparison circuit VGL over an AND element UG and can then be supplied to the third multiplexer MUX1. The point in time at which the selection signal is through-connected from the comparison circuit VGL to the function register FRG can then also be determined with the assistance of the selection signal SL.

The number of functions according to which the check characters are treated can be increased with the assistance of further control signals S1 which are emitted by the control computer RE. The point in time at which the individual outputs of the function register FRG are through-connected to the transmitter SG can be determined with the assistance of selection signals E1 through E3.

The construction of the address register can ensue with the assistance of commercially available modules, for example, 74 LS 373; the construction of the function register can ensue with commercially available modules, for example 74 LS 259, and the construction of the comparison circuit can ensue with the assistance of exclusive OR circuits.

It will be apparent that many modifications and variations may be made without departing from the scope of the teachings and concepts of the present invention.

SUPPLEMENTARY DISCUSSION

The selection lines S1-1, S1-2, etc., may be individual to the respective address registers ADR of the respective selection circuits AW1, AW2, etc., so that the control computer RE can individually activate the address registers ADR of the respective selection circuits for latching of a new address. In loading addresses into the respective selection circuits, the control computer would output to bus BS the selection and auxiliary address data to be stored in the address register ADR of selection circuit AW1, and then momentarily actuate line S1-1 to effect storage of the address data via internal bus BD. If the same selection address but a different auxiliary address is to be supplied to selection circuit AW2, such desired address data is then placed on the bus BS, and the selection line S1-2 momentarily actuated, and so on.

Thereafter in successive test cycles (or test events) of a testing operation, successive different machine words may be automatically supplied to bus BS from computer RE according to a pre-established program. The group of selection circuits having the same stored selection address will all respond each time a machine word is supplied having this common address, so that the overall duration of the testing operation is materially reduced.

During different testing operations, different groups of selection circuits can be set to respond to machine words with a given selection address, by automatically supplying the desired address data to bus BS and momentarily activating the respective selection lines S1-1, S1-2, etc. to effect storage of the new address data.

We claim as our invention:

1. An arrangement for transmitting check characters to selectable connector elements of a tester to which a unit under test can be connected, wherein the individual connector elements are selected with the assistance of an address, the improvement whereby a selection device is provided for controlling transmission of check characters to each connector element, each selection device comprising first means whereby different addresses are changeably stored therein, said selection devices having respective comparison means comparing the respective stored addresses stored by the respective first means to selection addresses of the check characters which are supplied to the selection devices during a test operation, and further means comprising an input bus connected with said selection devices for transmitting the selection addresses and check characters to the selection devices, each of said selection devices being responsive to equality of the selection address on the input bus with the stored address of the associated first means for transmitting an allocated check character to its associated connector element.

2. An arrangement according to claim 1, characterized in that each selection device has address register means connected to the input bus and providing the first means whereby different addresses are changeably stored, such different addresses being supplied to the address register means via said input bus, each selection device having a first input of its comparison means connected to said input bus and having a second input of its comparison means connected with said address register means, said input bus, during a test event, supplying a machine word including a plurality of check characters and one selection address with the selection address being supplied to the first input of each of said comparison means, and each selection device having a stored address corresponding to the one selection address transmitting a respective check character of said plurality of check characters to the associated connector element.

3. An arrangement according to claim 2, characterized in that each selection device includes auxiliary address storage means for controlling selection of one of the check characters from the plurality of check characters by means of a stored auxiliary address changeably stored therein.

4. An arrangement according to claim 3, with the address register means and auxiliary address storage means of each selection device forming an address register in which a desired address and auxiliary address are changeably stored, the comparison means comprising a comparison circuit which compares the address stored in the address register to the input address of the machine word pending at the input bus, and a first multiplexer being adjustable by means of the auxiliary address and having inputs connected to the input bus for the supply of the check characters and which transmits the check character allocated to the auxiliary address stored in the address register.

5. An arrangement according to claim 4, characterized in that the machine word contains a function code determining the type of employment of the check character; in that a function register is provided which, on the one hand, is connected to the input bus for the acceptance of the function code and which, on the other hand, is connected to the first multiplexer for the acceptance of the check character transmitted by the first multiplexer.

6. An arrangement according to claim 4, characterized in that a second multiplexer is provided whose one input is connected to the output of the first multiplexer and whose second input is connected to one of the inputs leading to the first multiplexer and which through-connects one of the two inputs as a function of a control signal.

7. An arrangement according to claim 5, characterized in that the output of the comparison circuit is connected to a selection input of the function register.

8. An arrangement according to claim 7, characterized in that a third multiplexer is disposed between the comparison circuit and the function generator, the one input of said third multiplexer being connected to the output of the comparison circuit and its second input having a selection signal supplied to it.

9. An arrangement according to claim 4, characterized in that the same address and the same auxiliary address can be stored in the address registers of a plurality of selection devices.

* * * * *